(12) United States Patent
Cohen

(10) Patent No.: US 7,205,837 B2
(45) Date of Patent: Apr. 17, 2007

(54) BODY EFFECT AMPLIFIER

(75) Inventor: Ariel Cohen, Jerusalem (IL)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 10/749,930

(22) Filed: Dec. 29, 2003

(65) Prior Publication Data

US 2005/0140441 A1    Jun. 30, 2005

(51) Int. Cl.
*H03F 3/45*      (2006.01)
(52) U.S. Cl. ........................... 330/253; 330/261
(58) Field of Classification Search ............... 330/253, 330/261
See application file for complete search history.

(56) References Cited

U.S. PATENT DOCUMENTS

| | | | | |
|---|---|---|---|---|
| 5,491,443 A | * | 2/1996 | Zarabadi | 327/391 |
| 5,694,072 A | * | 12/1997 | Hsiao et al. | 327/537 |
| 5,696,459 A | * | 12/1997 | Neugebauer et al. | 327/108 |
| 5,737,035 A | * | 4/1998 | Rotzoll | 348/725 |
| 5,760,647 A | * | 6/1998 | Miller et al. | 330/252 |
| 5,959,490 A | * | 9/1999 | Candage et al. | 327/333 |
| 6,064,263 A | * | 5/2000 | Nowak | 330/253 |
| 6,236,269 B1 | * | 5/2001 | Hojabri | 330/253 |
| 6,366,167 B1 | * | 4/2002 | Stockstad | 330/253 |
| 6,614,280 B1 | * | 9/2003 | Panwitz | 327/307 |
| 7,088,178 B1 | * | 8/2006 | Rosenfeld et al. | 330/253 |

* cited by examiner

*Primary Examiner*—Patricia Nguyen
(74) *Attorney, Agent, or Firm*—Schwegman, Lundberg, Woessner & Kluth, P.A.

(57) ABSTRACT

A circuit includes a transistor having a biased gate terminal and an input coupled to a bulk terminal. A voltage applied between the bulk terminal and the source terminal modulates the drain-source current. The transistor operates in a saturation region with a bias voltage applied to the gate terminal. The output current is received by a load resistor or an active load.

13 Claims, 6 Drawing Sheets

BODY EFFECT AMPLIFIER

FIELD

This subject matter pertains to amplifiers and in particular, to amplifiers having a bulk input terminal.

BACKGROUND

The input pair of transistors in a traditional differential amplifier do not operate in the saturation region when the differential input signal has a common mode voltage level that exceeds the available power supply. When not in saturation, the gain of the input stage is low.

For these and other reasons, an improved amplifier is needed.

DESCRIPTION

In the following detailed description, reference is made to the accompanying drawings that form a part hereof, and in which is shown, by way of illustration, specific embodiments in which the present subject matter may be practiced. These embodiments are described in sufficient detail to enable those skilled in the art to practice the subject matter, and it is to be understood that the embodiments may be combined, or that other embodiments may be utilized and that structural, mechanical, logical and electrical changes may be made without departing from the scope of the present subject matter. The following detailed description is, therefore, not to be taken in a limiting sense, and the scope of the present subject matter is defined by the appended claims and their equivalents.

Figure 1A:
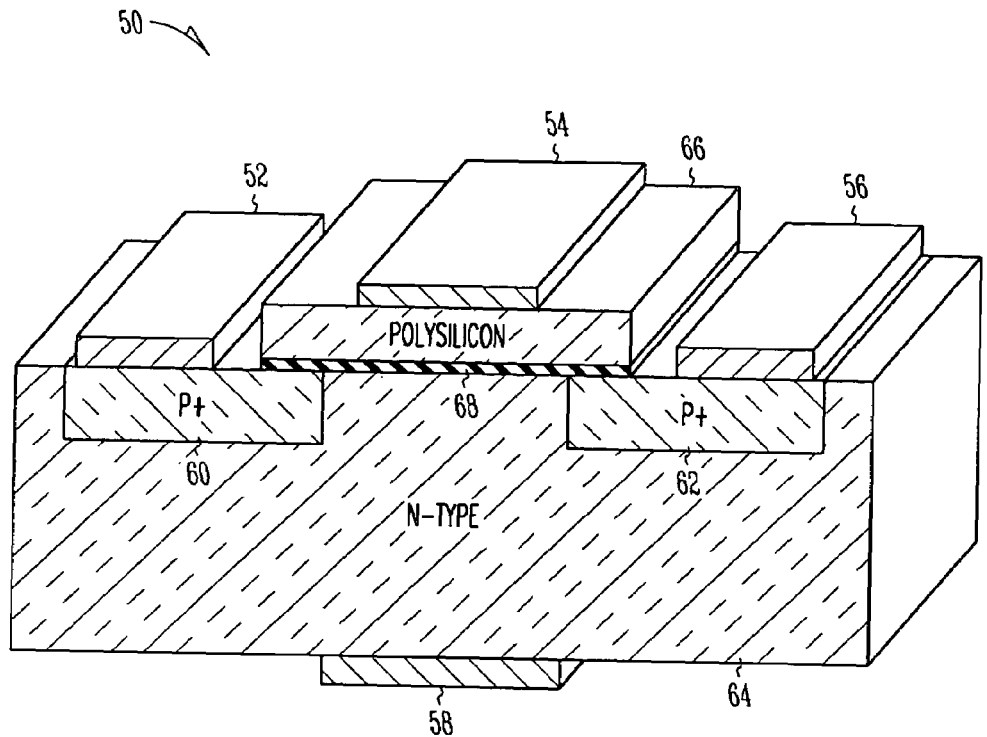
FIG. 1A includes a cross-sectional view of a transistor according to one embodiment of the present subject matter.

FIG. 1A includes a cross-sectional view of transistor 50 according to one embodiment of the present subject matter. Transistor 50, in various embodiments includes a field effect transistor such as an insulated gate field effect transistor or a metal oxide semiconductor field effect transistor.

In the figure, transistor 50 is illustrated as a p-type transistor, however, n-type transistors are also contemplated. Transistor 50 includes n-type substrate 64 having $p^+$ doped region 60 and $p^+$ doped region 62. Regions 60 and 62 each are electrically coupled to metal electrodes 52 and 56, respectively. In addition, polysilicon layer 66 is disposed between doped regions 60 and 62 and separated by gate oxide layer 68. Gate oxide layer 68, in a small transistor, is relatively thin and can degrade quickly upon exposure to high voltages.

An electrical connection to polysilicon layer 66 is provided by electrode 54. An electrical connection to substrate 64 is provided by electrode 58. Electrode 54 is commonly referred to as a gate terminal and electrode 58 is commonly referred to as a bulk terminal, n-well terminal or body terminal. For an n-type transistor, the bulk terminal may be connected to a p-well.

Electrodes 52 and 56 are electrically identical and each are sometimes referred to as a source/drain. In the context of an electrical circuit, one electrode is commonly designated as a source and the other is commonly designated as a drain. In the figures, the electrode nearest the arrow is referred to as the source.

In the present subject matter, an input signal is provided to the bulk terminal. Modulation of the input signal causes modulation of the current through the transistor. In one embodiment, a gate terminal is biased.

Figure 1B:
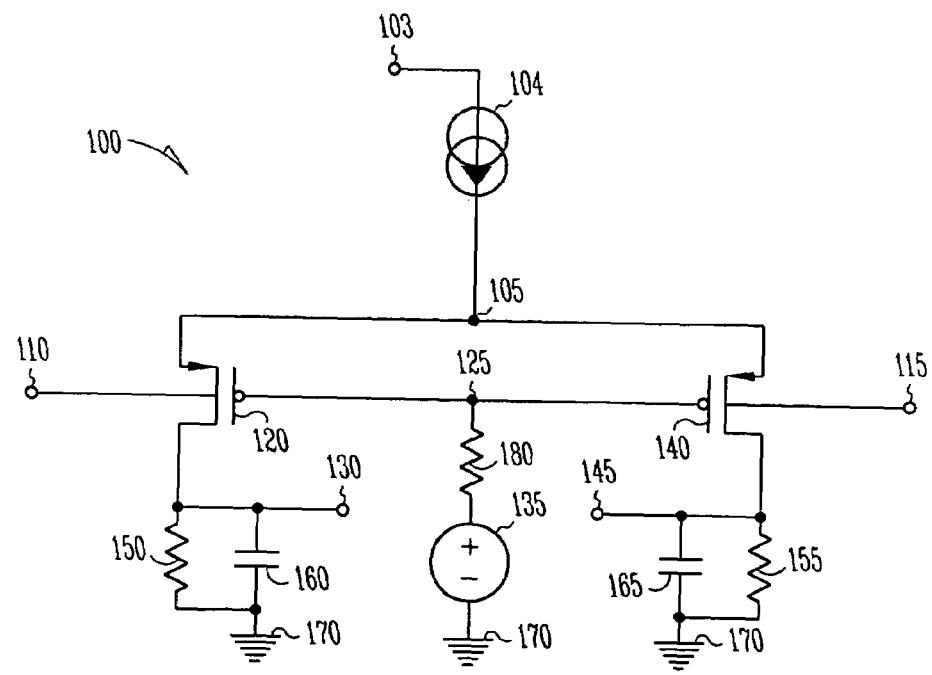
FIG. 1B includes a schematic of a differential pair according to one embodiment of the present subject matter.

FIG. 1B illustrates amplifier circuit 100 having transistor 120 and transistor 140. Transistors 120 and 140, sometimes referred to as a pair, or as a differential pair, include field effect transistors such as that depicted by transistor 50. Input node 110 and input node 115 are each separately coupled to a bulk terminal of transistor 120 and transistor 140, respectively.

A gate terminal of transistor 120 and a gate terminal of transistor 140 are electrically coupled to node 125. Node 125 is biased by a series combination of resistor 180 and voltage supply 135. In one embodiment, node 125 is biased by a resistive voltage divider network or other voltage source. Other circuitry for biasing node 125 is also contemplated. The common gate terminal of transistors 120 and 140 establishes a bias point for each transistor.

The bias voltage on node 125 can be adjusted to compensate for device performance. For example, in one embodiment, the bias voltage is adjusted based on at least one of any combination of an operating temperature, a supply voltage, fabrication process and input common mode voltage.

The source terminal of transistor 120 and the source terminal of transistor 140 are electrically coupled to node 105. In one embodiment, node 105 is biased by current source 104 coupled to a supply voltage at 103, as shown at FIG. 1B. In one embodiment, node 105 is coupled directly to $V_{DD}$. In one embodiment, the supply voltage at node 103 is $V_{DD}$. A typical value for $V_{DD}$ is 1.8 volts DC with a range of values between 1.71 and 1.89 volts. Values higher or lower than these are also contemplated.

Output node 130 is coupled to the drain terminal of transistor 120 and output node 145 is coupled to the drain terminal of transistor 140. Each of output nodes 130 and 145 are separately coupled to reference node 170 by a passive load. In the figure, reference node 170 is illustrated as an electrical ground, however, other reference levels are also contemplated. Output node 130 is coupled to reference node 170 by the parallel combination of resistor 150 and capacitor 160. Output node 145 is coupled to reference node 170 by the parallel combination of resistor 155 and capacitor 165. In one embodiment, the parallel combination of a resistor and a capacitor is replaced by an active load.

The resistance value of resistors 150 and 155 correspond to the output impedance of transistor 120 and transistor 140, respectively. The capacitance of capacitors 160 and 165 is presented for simulation of the node and the next stage capacitance. In one embodiment, the capacitors are omitted since parasitic capacitance affects performance of the circuit at high frequency.

The variation of the threshold voltage of a transistor due to a variation of the substrate or bulk voltage is sometimes referred to as body effect. In accordance with the present subject matter, the voltage at the bulk terminal, $V_{SB}$, is used to modulate the current through the transistor, $I_{ds}$. The transconductance bulk-channel ($g_{mbs}$) is a result of the modulation of the threshold voltage ($V_T$) by the bulk-source voltage as describe in equations 1 and 2 below.

$$V_T = V_{T0} + \gamma\left(\sqrt{2|\Phi_F| + V_{SB}} - \sqrt{2|\Phi_F|}\right) \quad \text{Equation 1}$$

$$g_{mbs} = \frac{-\partial I_D}{\partial V_{SB}} = -\left(\frac{\partial I_D}{\partial V_T}\right)\left(\frac{\partial V_T}{\partial V_{SB}}\right) \quad \text{Equation 2}$$

$$g_{mbs} = \frac{\gamma[\beta(V_{GS} - V_T)]^{1/2}}{2[2|\Phi_F| + V_{SB}]^{1/2}} = \frac{\gamma(2I_D\beta)^{1/2}}{2[2|\Phi_F| + V_{SB}]^{1/2}} \quad \text{Equation 3}$$

Where
γ=bulk threshold parameter
$\Phi_F$=strong inversion surface potential
β=transconductance parameter In one embodiment, transistors 120 and 140 operate in the saturation region because the bias voltage at node 125 is higher than the output common voltage at nodes 130 and 145. Therefore transistors 120 and 140 have a high transconductance bulk-source ($g_{mbs}$) and high output resistance ($r_{ds}$). Equations 1, 2 and 3 illustrate the amplification achieved as between the bulk voltage and the current through the transistor. In particular, equations 1, 2 and 3 illustrate the effect of $V_{SB}$ on threshold voltage $V_T$.

The equations presented here depend on the DC operation point of the transistor. In various embodiments, the transistors are biased for operation in a saturation or linear mode. The transistors are operated in saturation region by tuning the bias voltage at node 125.

In one embodiment, the junction between node 105 and node 110 is maintained in a reverse bias mode. For example, the voltage on node 110 is no lower than 0.7–0.8 volts below that of node 105. If this junction is operated in a forward bias, then the transistor junction will open. In one embodiment, this junction is operated in a reverse bias mode by selection of predetermined operating voltages.

A circuit according to FIG. 1B demonstrated a minimum amplification gain of approximately −1.7 dB at $V_{DD}$ of 1.71 volts with a frequency of 800 Mhz and a common voltage at the input nodes of 2.35 volts over all corners and temperature. Amplification gain of −1.7 dB of the present subject matter compares favorably with a traditional differential amplifier having a gain of approximately −18 dB. Current consumption was demonstrated at about 200 μA. The dimensions of transistors 120 and 140 are approximately 8 microns in width by 0.36 microns in length.

Figure 2:
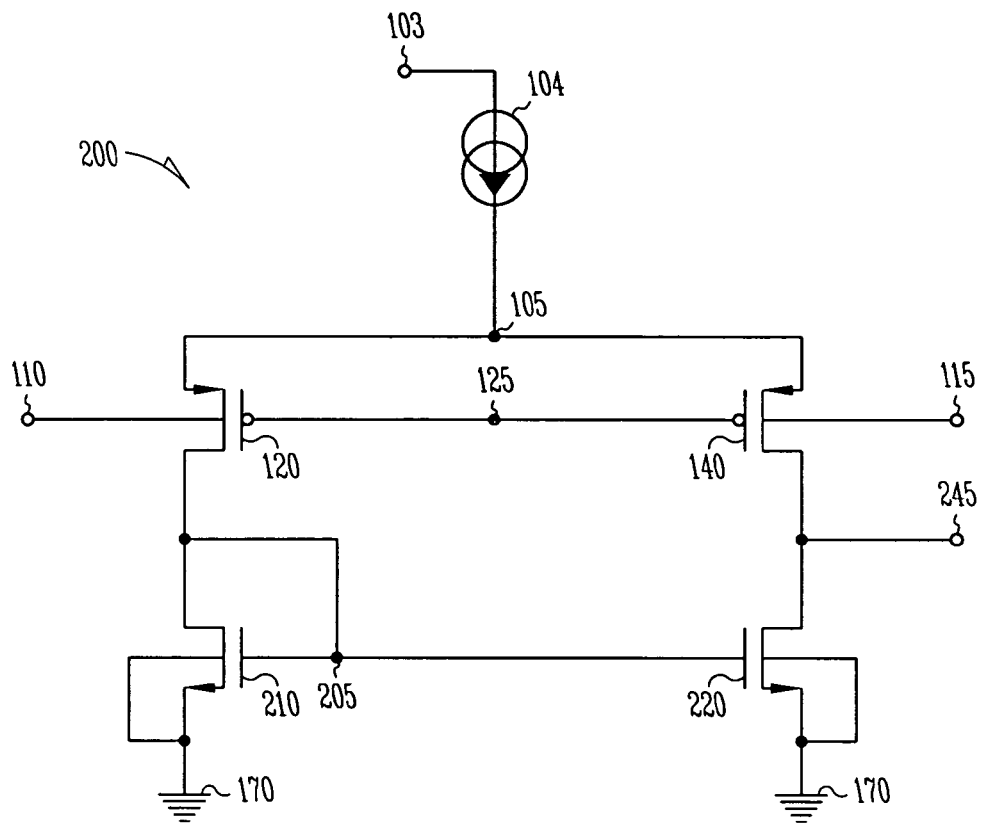
FIG. 2 includes a schematic of a differential pair having an active load according to one embodiment of the present subject matter.

FIG. 2 illustrates amplifier 200 having a single ended output and an active load. In particular, the drain terminal of transistor 120 is coupled to node 205. Node 205 is further coupled to both the drain terminal and a gate terminal of transistor 210 as well as a gate terminal of transistor 220. A bulk terminal and a source terminal of transistor 210 are coupled to reference node 170. A drain terminal of transistor 140 is coupled to output node 245 and also to a drain terminal of transistor 220. A bulk terminal and a source terminal of transistor 220 are coupled to reference node 170.

A differential input signal is applied to input node 110 and input node 115, each of which are coupled to bulk terminals of transistors 120 and 140, respectively.

In one embodiment, node 105, as shown in FIG. 2, is coupled to a supply voltage at node 103 by current source 140. Current source 140, in one embodiment, includes a transistor. In one embodiment, node 105 is coupled directly to $V_{DD}$. In addition, node 125 is coupled to a voltage source (not shown), such as that of FIG. 1B. Other voltage sources are also contemplated, including, for example, a voltage divider network.

The output current in FIG. 1B flows through resistors 150 and 155. In contrast to FIG. 1B, the output current in the circuit of FIG. 2 flows through a current mirror.

Effectively, the output current flows through a resistor (or active load) in parallel with the transistor output impedance. For a high gain, the transistor output resistance is selected to be high. The transistor output resistance, $r_{ds}$, is a measure of AC resistance between the source and the drain.

Figure 3:
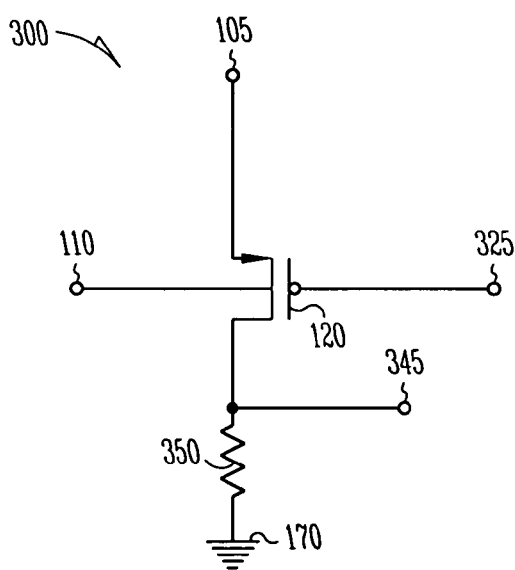
FIG. 3 includes a schematic of a single ended amplifier according to one embodiment of the present subject matter.

FIG. 3 includes a schematic of single ended amplifier 300 according to one embodiment of the present subject matter. In the figure, the source terminal of transistor 120 is coupled to a supply voltage at node 105. In one embodiment, the source terminal of transistor 120 is coupled to a current source at node 105. The current source, in one embodiment, includes a transistor.

The drain terminal of transistor 120 is coupled to output node 345 and also resistor 350 to reference node 170. In one embodiment, resistor 350 is replaced with an active load. Input node 110 is coupled to a bulk terminal of transistor 120.

A voltage applied to node 105 biases transistor 120. Node 325 is coupled to a bias voltage source by, for example, a voltage divider network.

The present subject matter can function as a stage of a multi-stage amplifier or a logical gate, such as an inverter, or other circuit. Representative of such other devices is FIG. 4 which illustrates communication device 400. In the figure, device 400 represents a radio frequency receiver such as, for example but not by way of limitation, that of a cellular telephone, pager, or other wireless device. In the figure, antenna 402 is coupled to preamplifier 412 by tuner 414. Antenna 402 has an output terminal coupled to node 404 which is also coupled to the input of tuner 414. An output signal from tuner 414 is coupled, at node 416, to a bulk terminal of transistor 120. In addition, output node 345, coupled to a drain of transistor 120, is also coupled to an input terminal of amplifier 406. Amplifier 406 represents an intermediate stage or power amplifier for the low level signal provided by preamplifier 412. Amplifier output terminal 408 is coupled to circuit 410. In various embodiments, circuit 410 represents electrical circuitry, such as for example but not by way of limitation, an amplifier, a mixer, a multiplexer, a logic gate, a microprocessor, memory or other circuitry configured to perform a function as a communication device. Transistor 120 is biased at node 105 and node 325. Load resistor 350 couples the drain of transistor 120 to reference node 170.

Figure 4A:
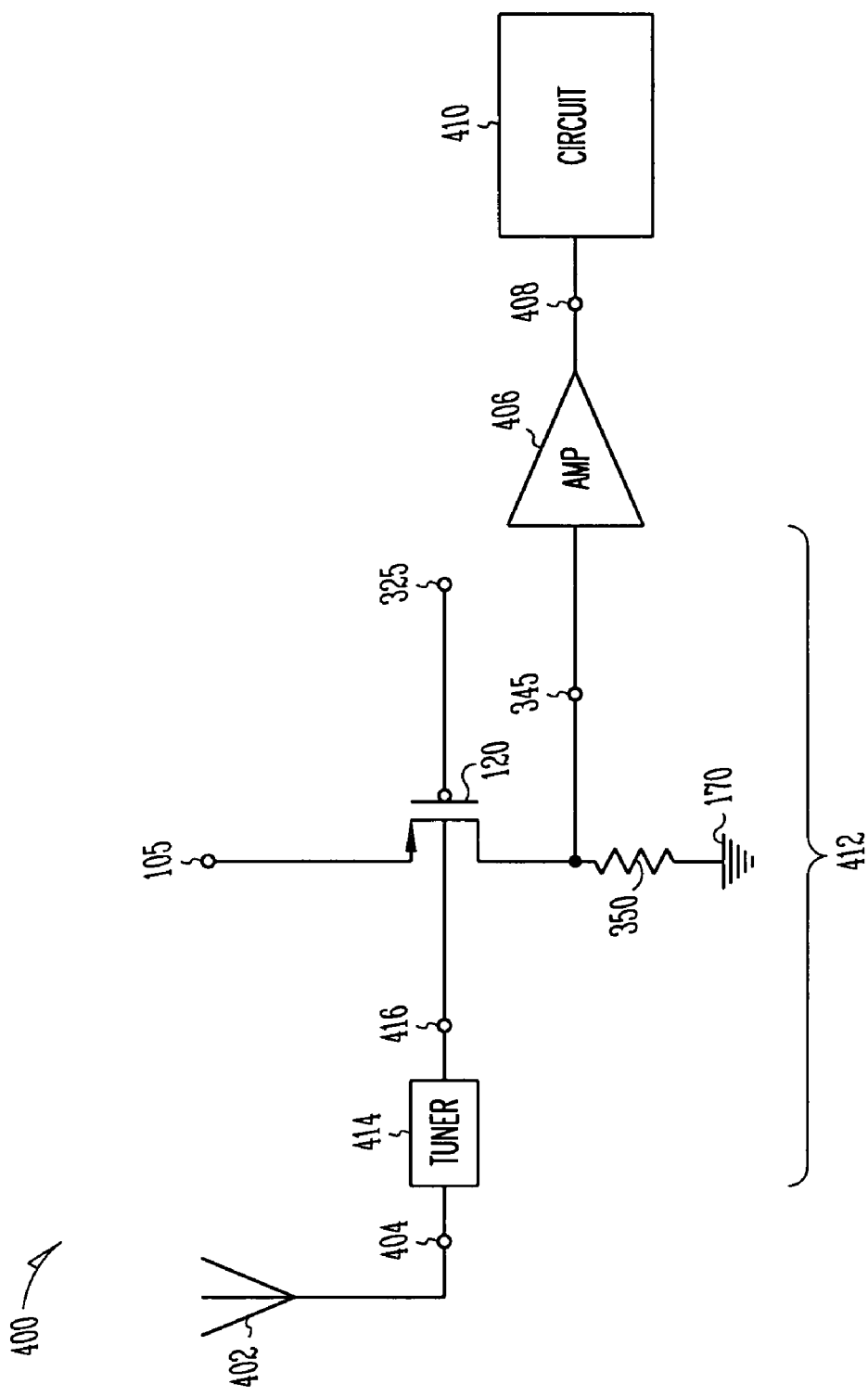
FIG. 4A includes a schematic of an antenna circuit according to one embodiment of the present subject matter.

FIG. 4 illustrates a single ended amplifier however, it will be understood that a differential amplifier, as described herein, may also be used with an antenna. For example, with a dipole antenna, a first input of a differential pair is coupled to a first member of the antenna and a second input is coupled to a second member of the antenna.

Performance of the circuit according to the present subject matter can be adjusted by selecting operating voltages, currents, component values and properties and a particular configuration. Equations 1, 2 and 3 can be used to tailor the circuit performance for a particular application.

Figure 4B:
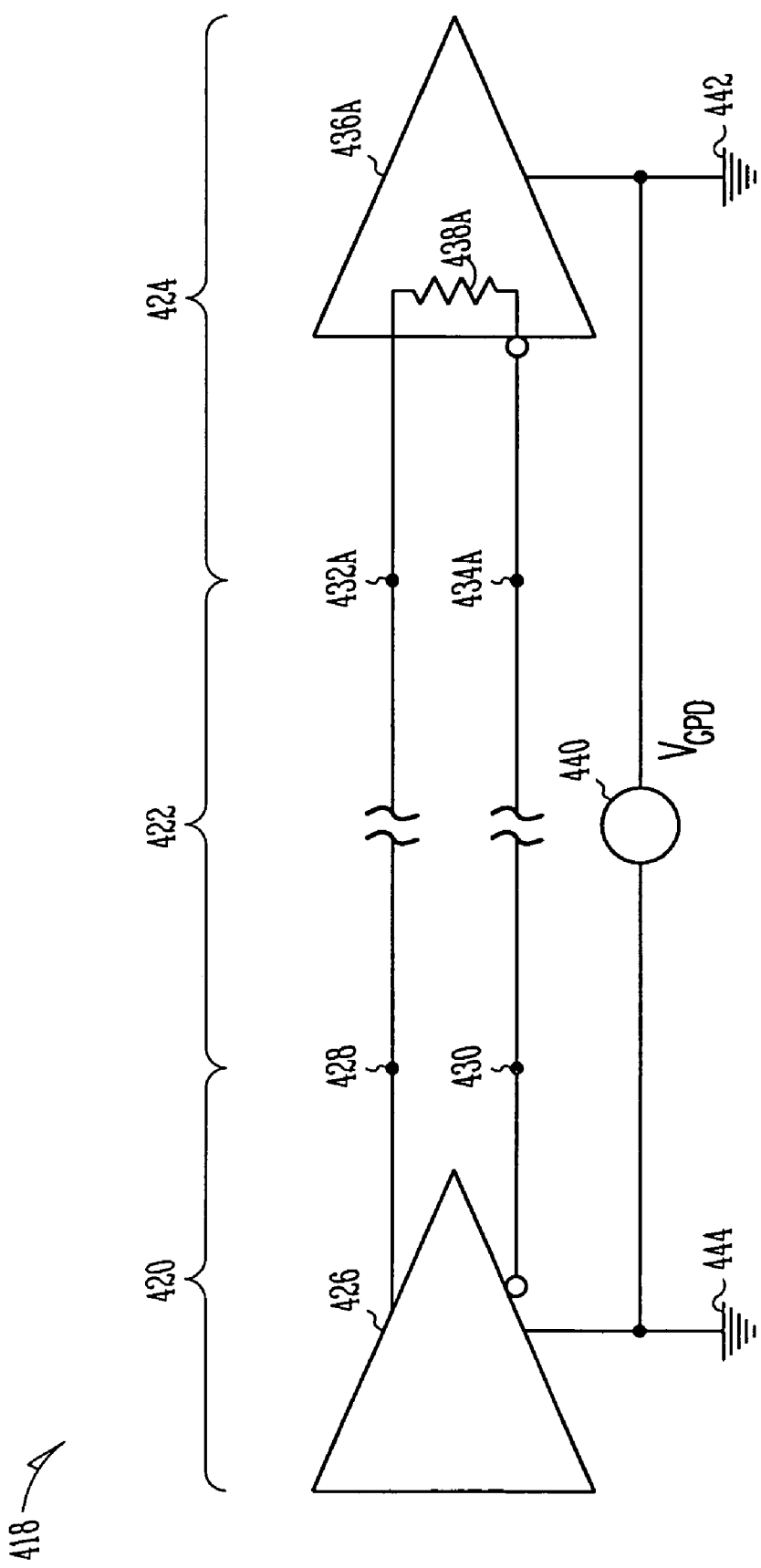
FIG. 4B includes a schematic of a low voltage differential signaling interface.

FIG. 4B includes a schematic of low voltage differential signaling interface 418. In the figure, driver 420 includes transmitter amplifier 426 which provides a differential output signal at nodes 428 and 430. Interconnect 422 provides an electrical coupling between driver 420 and receiver 424. Receiver 424 includes differential amplifier 436A having differential inputs at nodes 432A and 434A. Differential amplifier 436A presents an input impedance represented by 438A. In the figure, amplifier 426 and amplifier 436A are each separately coupled to reference node 444 and reference node 442, respectively. In addition, voltage supply 440 represents a ground potential delta between the respective amplifiers.

In various embodiments, driver 420, interconnect 422 and receiver 424 are disposed on one or more circuit boards or substrates.

Figure 4C:
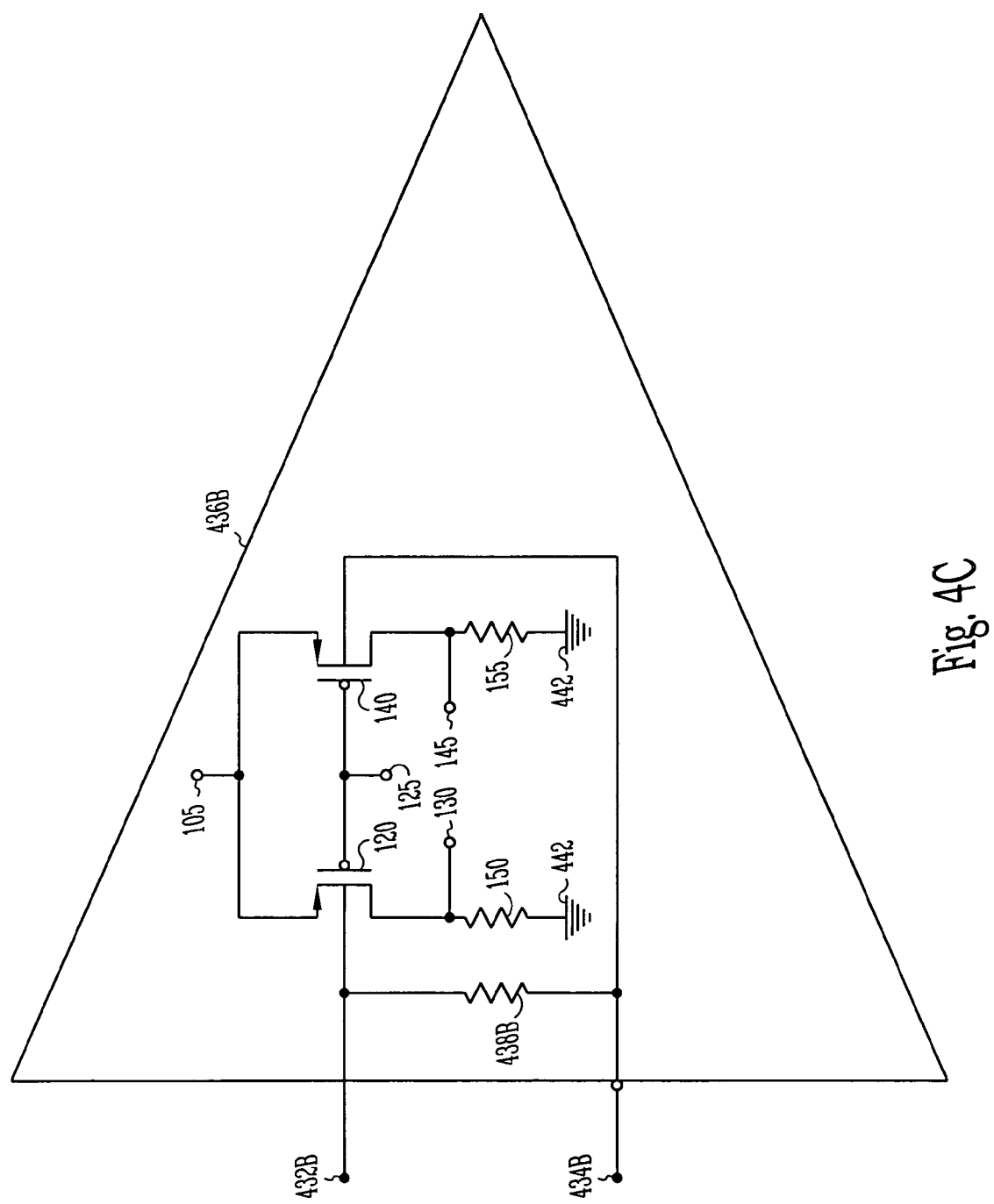
FIG. 4C includes a schematic of a differential amplifier for an interface according to one embodiment of the present subject matter.

FIG. 4C includes a schematic of differential amplifier 436B for an interface according to one embodiment of the present subject matter. In the figure, input node 432B and complementary input node 434B provide a differential input signal to amplifier 436B. Node 432B and node 434B are coupled to a bulk terminal of transistor 120 and transistor 140, respectively. Shunting node 432B and 434B is input resistor 438B. Node 105 and node 125 are biased at voltage and current levels to allow the differential pair of transistors 120 and 140 to operate as a differential amplifier. A differential output signal is provided at nodes 130 and 145. Resistors 150 and 155 couple the drain terminals of transistors 120 and 140, respectively, to reference potential 442. Other configurations for amplifier 436B are also contemplated, including, for example, a single ended output using a current mirror or other active load.

Figure 5:
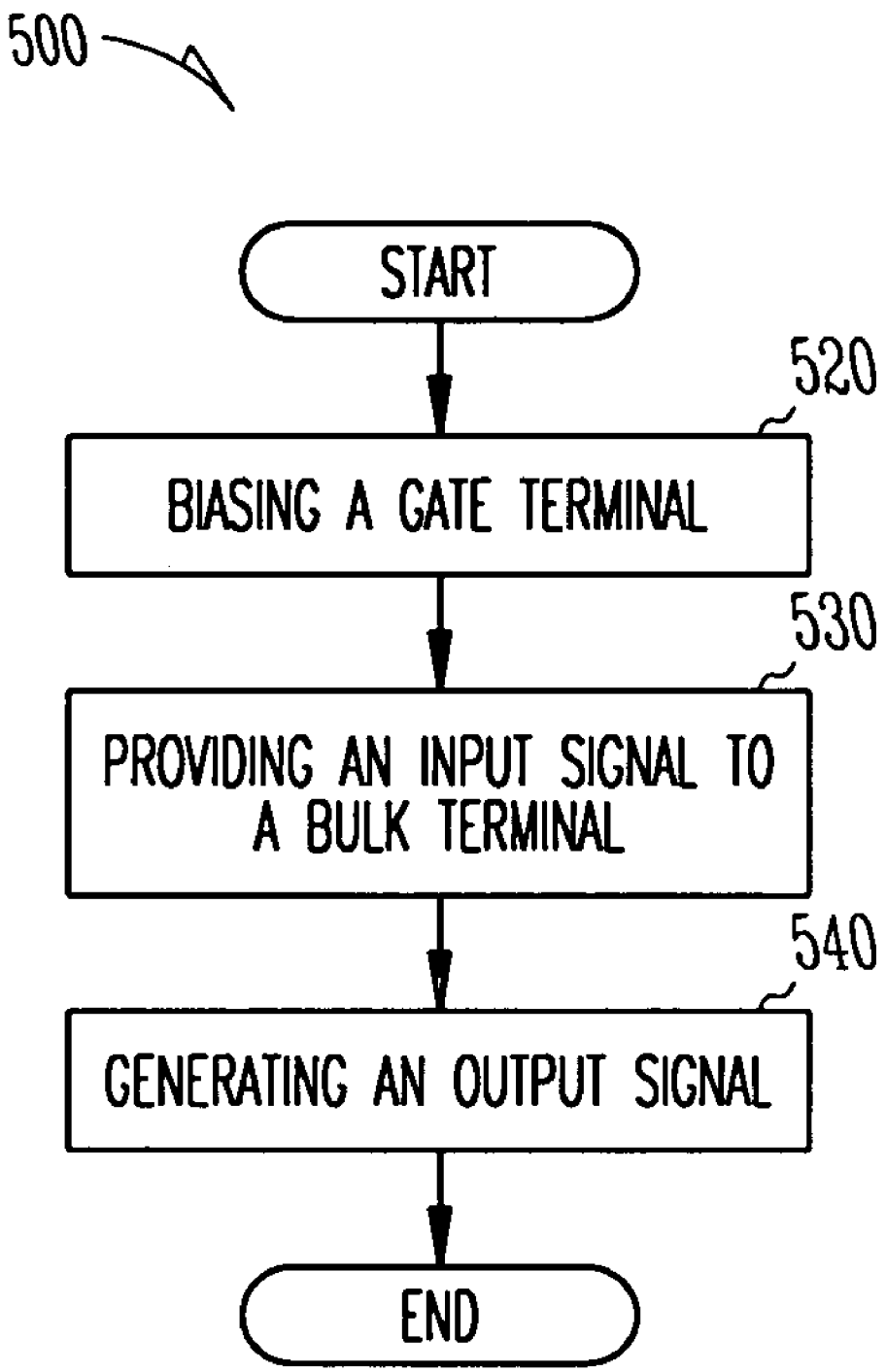
FIG. 5 includes a flow chart of a method according to one embodiment of the present subject matter.

FIG. 5 illustrates a flow chart of a method 500 according to one embodiment of the present subject matter. At 520, method 500 includes biasing a gate terminal of a transistor. The transistor is part of an amplifier circuit or a logic circuit. In various embodiments, the transistor includes an insulated gate field effect transistor or a metal oxide semiconductor field effect transistor. In various embodiments, biasing includes providing a bias voltage from a supply. For example, a resistive voltage divider network or a current source and a resistor can provide a bias voltage. At 530, an input signal is provided to a bulk terminal of the transistor. In one embodiment, the input signal includes a first and second differential input signal. At 540, an output signal is generated as a function of the signal on the bulk terminal and the bias on the gate terminal. In one embodiment, a single ended or differential output signal is generated where each output signal is a function of the corresponding input signal. The output signal is generated at the drain terminal of the circuit. In one embodiment, the output signal is derived from a particular terminal of the transistor for which the gate terminal is biased and the input is provided on the bulk terminal. In one embodiment, the output signal is derived from a particular terminal of a transistor that differs from the transistor for which the gate terminal is biased and the input is provided on the bulk terminal.

In one embodiment, method 500 includes biasing a source/drain terminal of the transistor. Biasing, for example, includes providing a supply voltage to the source/drain terminal or providing a current source. In one embodiment, the transistor is operating in a saturation mode.

ALTERNATIVE EMBODIMENTS

The figures illustrate a p-type transistor. However, it is understood that an n-type transistor is also suitable for use in the present subject matter with a complementary change in polarity.

This present subject matter can be used as an input stage for an amplifier. In addition, the present subject matter can be used to amplify an input signal having a common mode voltage in excess of the power supply voltage.

Transistors larger or smaller than 8 microns wide by 0.36 microns length are also contemplated. In general, a larger transistor reduces mismatch between adjacent stages of an amplifier.

CONCLUSION

The above description is intended to be illustrative, and not restrictive. Many other embodiments will be apparent to those of skill in the art upon reviewing the above description.

What is claimed is:

1. A circuit comprising:
    a differential pair to receive a differential signal at a bulk input port and to generate an output signal at an output port and
    further including a common source/drain terminal of the differential pair coupled to a current source, and wherein a common gate of the differential pair is biased to operate the differential pair in a saturation mode.

2. A circuit comprising:
    a differential pair to receive a differential signal at a bulk input port and to generate an output signal at an output port, the differential pair having a biased common gate and configured to operate in a saturation mode, and further including an amplifier coupled to the output port.

3. A circuit comprising:
    a differential pair configured to operate in a saturation mode and configured to receive a differential signal at a bulk input port and to generate an output signal at an output port and further including an active load coupled to the drain output port and wherein the active load includes a transistor pair having a common gate.

4. A circuit comprising:
    a first transistor having a first bulk and a first drain;
    a first input node at the first bulk; and
    a first output node at the first drain and wherein the first transistor includes a first source to receive a bias current and wherein the first transistor is biased to operate in a saturation mode.

5. A circuit comprising:
    a first transistor having a first bulk and a first drain;
    a first input node at the first bulk; and
    a first output node at the first drain and wherein the first transistor includes a first source coupled to a supply voltage and wherein the first transistor is biased to operate in a saturation mode.

6. A circuit comprising:
    a first transistor having a first bulk and a first drain;
        a first input node at the first bulk; and
        a first output node at the first drain; and and further including
    a second transistor having a second gate in common with the first gate, the second transistor having a second bulk and a second drain;
        a second input node at the second bulk; and a second output node at the second drain and wherein the first transistor and the second transistor are biased to operate in a saturation mode and include a common source.

7. The circuit of claim 6 further including a current source coupled to the common source/drain.

8. A method comprising:

biasing a gate terminal of a first transistor in an amplifier, wherein the first transistor is operated in a saturation mode;

providing an input signal to a bulk terminal of the first transistor; and generating a first output signal as a function of the input signal at a first output terminal coupled to a first drain terminal of the amplifier and wherein providing the input signal includes providing a first differential input signal to the first transistor of a differential pair and providing a second differential input signal to a second transistor of the differential pair, and further including biasing a source terminal of the first transistor.

9. The method of claim 8 wherein biasing the source terminal includes providing a current source.

10. A communication device comprising:

an antenna having an antenna output;

a first amplifier including a transistor having a bulk terminal coupled to the antenna output and a bias node coupled to a gate terminal of the transistor wherein the transistor is operated in a saturation mode; and a second amplifier having an input coupled to a first drain node of the first amplifier and wherein the bulk terminal is coupled to the antenna output via a tuner.

11. A communication device comprising:

an antenna having an antenna output;

a first amplifier including a transistor having a bulk terminal coupled to the antenna output and a bias node coupled to a gate terminal of the transistor wherein the transistor is operated in a saturation mode; and a second amplifier having an input coupled to a first drain node of the first amplifier and further including a second source terminal of the transistor coupled to a power supply.

12. The device of claim 11 wherein the power supply includes a current source.

13. A communication device comprising:

an antenna having an antenna output;

a first amplifier including a transistor having a bulk terminal coupled to the antenna output and a bias node coupled to a gate terminal of the transistor wherein the transistor is operated in a saturation mode; and a second amplifier having an input coupled to a first drain node of the first amplifier and wherein the first amplifier includes a differential amplifier.

* * * * *